US011129301B2

United States Patent
Meyer et al.

(10) Patent No.: US 11,129,301 B2
(45) Date of Patent: Sep. 21, 2021

(54) THERMALLY CONDUCTIVE INSULATOR

(71) Applicant: Siemens Aktiengesellschaft, Munich (DE)

(72) Inventors: Angelo Meyer, Nuremberg (DE); Stephan Neugebauer, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 84 days.

(21) Appl. No.: 16/332,676

(22) PCT Filed: Aug. 24, 2017

(86) PCT No.: PCT/EP2017/071333
§ 371 (c)(1),
(2) Date: Mar. 12, 2019

(87) PCT Pub. No.: WO2018/059843
PCT Pub. Date: Apr. 5, 2018

(65) Prior Publication Data
US 2020/0396865 A1  Dec. 17, 2020

(30) Foreign Application Priority Data
Sep. 29, 2016  (EP) .................................... 16191443

(51) Int. Cl.
*H05K 7/20* (2006.01)
*H01L 23/367* (2006.01)

(52) U.S. Cl.
CPC ..... *H05K 7/20409* (2013.01); *H01L 23/3672* (2013.01); *H05K 7/20445* (2013.01); *H05K 7/2039* (2013.01); *H05K 7/20336* (2013.01)

(58) Field of Classification Search
CPC ........... H05K 7/20409; H05K 7/20445; H05K 1/0203; H01L 23/36–4735
USPC ........................ 361/679.46–679.54, 688–723
See application file for complete search history.

(56) References Cited

U.S. PATENT DOCUMENTS

| 5,518,758 | A  | 5/1996  | Tiburtius et al. |
| 5,948,689 | A  | 9/1999  | Hamburgen et al. |
| 6,604,575 | B1 | 8/2003  | Degtiarenko |
| 8,031,464 | B2 * | 10/2011 | Adkins ..................... G06F 1/20 361/679.47 |
| 8,070,324 | B2 * | 12/2011 | Kornitz ................. G05D 23/24 362/294 |

(Continued)

FOREIGN PATENT DOCUMENTS

| KR | 20090129663 A | 12/2009 |
| RU | 2152697 C1 | 7/2000 |

OTHER PUBLICATIONS

PCT International Search Report and Written Opinion of International Searching Authority dated Aug. 31, 2018 corresponding to PCT International Application No. PCT/EP2017/071333 filed Aug. 24, 2017.

*Primary Examiner* — Zachary Pape
(74) *Attorney, Agent, or Firm* — Henry M. Feiereisen LLC

(57) ABSTRACT

A thermally conductive insulator includes a first part having first fins arranged on a surface of the first part, and a second part having second fins arranged on a surface of the second part. The first fins and the second fins are arranged in such a way that they mesh with one another. Arranged between the first and second parts in a region of the first and second fins is an insulating layer.

12 Claims, 3 Drawing Sheets

(56) References Cited

U.S. PATENT DOCUMENTS

| | | | |
|---|---|---|---|
| 8,917,510 B2* | 12/2014 | Boday | H01L 23/42 |
| | | | 361/705 |
| 2002/0024796 A1 | 2/2002 | Shih | |
| 2012/0293952 A1 | 11/2012 | Herring et al. | |
| 2013/0098417 A1* | 4/2013 | Gavillet | H01L 35/30 |
| | | | 136/200 |
| 2017/0273218 A1* | 9/2017 | Stoermer | H01L 23/433 |

* cited by examiner

THERMALLY CONDUCTIVE INSULATOR

CROSS-REFERENCES TO RELATED APPLICATIONS

This application is the U.S. National Stage of international Application No. PCT/EP2017/071333, filed Aug. 24, 2017, which designated the United States and has been published as International Publication No. WO 2018/059843 and which claims the priority of European Patent Application, Serial No. 161914431, filed Sep. 29, 2016, pursuant to 35 U.S.C. 119(a)-(d).

BACKGROUND OF THE INVENTION

The invention relates to a thermally conductive insulator. Furthermore, the invention relates to a cooling arrangement with at least one such thermally conductive insulator.

In electrical conductors and components, in particular on power semiconductors, and at their contact points, electrical energy is converted into power dissipation and thus into heat. This heat must be discharged in order to prevent the conductor or component from overheating or impermissibly high temperatures from occurring.

If conductors to be cooled, such as, for instance, a bulbar and an available heat sink, such as for instance a cooling element, are at a different electrical potential and are both electrically conductive, the insulator must be adequately electrically insulating. Moreover, good thermal conductivity is useful for an effective cooling.

In this process materials which have the same good thermal conductivity, and also good electrical insulation properties are barely known, however. Ceramics are prominent in this field, but can often not be readily used on account of their brittleness, Plastics would be better suited to this although in most instances they have relatively poor thermal conductivity.

In addition to cooling, almost all mechanical components must be fastened mechanically to a support structure and therefore must be able to absorb forces without running of the risk of getting damaged in the process.

Nowadays electrical components on different potentials are therefore typically connected in a planar manner by way of relatively poor thermally conductive components.

If a significant degree of cooling is required, use is often made of convective, liquid cooling, for instance using air or water.

The object underlying the present invention is to improve an insulator with respect to its thermal conductivity.

SUMMARY OF THE INVENTION

The object is achieved by a thermally conductive insulator having a first part with first fins, which are arranged on at least one surface of the first part, and a second part with second fins, which are arranged on at least one surface of the second part, wherein the first fins and the second fins are arranged in such a way that they mesh with one another, wherein an insulating layer is arranged between the first part and the second part at least in the region of the fins. Furthermore, the object is achieved by a cooling arrangement with at least one such thermally conductive insulator, wherein the first part is connected to a heat source and the second part is connected to a heat sink.

Advantageous embodiments of the invention are specified in the dependent claims.

The knowledge underlying the invention is that the thermal conductivity can be significantly improved, whereby the insulating layer for electrical insulation extends across a large surface and the heat transfer is distributed on this surface. Geometrically the insulator is advantageously configured such that the at the first part and the second part of the insulator are arranged with their fins interlaced. This allows a significantly larger surface to be used for a heat transfer compared with the planar contacting. Furthermore, with form- or material-fit connections, significantly higher mechanical stabilities are achieved with the insulator than with a smaller surface.

The interlacing, in other words the comb-shaped formation of the first and second part which mesh with one another can be carried out by means of fins aligned in a straight line. Other geometries, such as, for instance, concentric circles etc, are also possible as an alternative or across a section. The latter would produce varying mechanical loading capacities.

By inserting the fins into one another at different depths, different insulator lengths can be generated from the same basic components. This is possible both with a casting and also with an injection of the first and the second part with one another.

It has proven particularly advantageous for an electrical functional component to be arranged between the first part and the second part. Such an integration of an electrical functional component between the conductive components is possible for instance for capacitors (C; FIG. 1), resistors (R; FIG. 1) or temperature sensors (T; FIG. 1) with optical or radio coupling. This hereby allows a particularly compact design to be achieved. At the same time, these functional components increase the thermal conductivity between the first part and the second part and therefore improve the thermal conductivity of the insulator while simultaneously extending the function of the insulator.

This design has a plurality of advantages. Different functions such as for instance heat transfer, mechanical fixing, oscillation damping, tolerance compensation are simultaneous by means of just one component. In this process the heat transfer is considerably higher than with a planar connection. Similarly, the mechanical stability is higher. On account of the design of the insulator, thin layers of poor thermally conductive insulating material are possible in the insulating layer and in the process high electrical voltages can be present.

Additional, insulating components are no longer required for fastening purposes since the components of the insulator are already fixedly connected to one another. The insulator itself can be designed to be robust, There is also no risk of breakage during assembly, such as for instance with interposed insulating plates made from ceramic. Moreover, this is advantageous in that components can be fastened by means of the thermally conductive insulator. This is particularly advantageous for fastening components of a cooling arrangement.

Contrary to a liquid cooling, a mechanical retaining function is additionally ensured. On account of the large surface, soft insulating materials can also be used instead.

In the case that a cooling arrangement is used for a busbar cooling, significantly higher currents are permitted with the same busbar cross-section. This results in a significant space, material and cost saving. Higher power densities are therefore possible, particularly with water-cooled devices.

In an advantageous embodiment of the invention, the first part and/or the second part are made from metal. Metal such as copper or aluminum, for instance, has proven reliable for producing cooling elements with a high thermal conductivity. It has therefore proven advantageous to use a metal to produce the first part and/or the second part. The first part and/or the second part then therefore consists of metal in each case. The insulating property is then achieved solely by the insulating layer.

Different materials can be used here for the conductive parts, in other words the first and the second part, in order inter alia to improve the cost-benefit ratio of the insulator. Therefore, the use of copper has proven particularly advantageous for the side which is provided for the connection of the heat source, in order to ensure a good heat transport. The second part which brings about a large material loss during milling, for instance, could be produced from aluminum. On account of the separation with an insulating material, the formation of an electrochemical element, which can cause corrosion, is reliably prevented in this regard.

The electrically conductive components of the first and the second part have a defined distance relative to one another when electrically conductive materials with a first and second part are used in order to retain the required insulating clearance. The minimum distance is dependent on the voltage to be insulated and the insulation material of the insulating layer.

The individual components of the insulator are connected to one another with a form-, force- or material fit in order to provide the required mechanical retaining function. The connection can be produced, for Instance, by means of curing a component, such as, for instance, an insulating material, an additional soldering metal or an additional adhesive, or injecting the compound.

In a further advantageous embodiment of the Invention, the first fins and/or the second fins each comprise further fins. The advantage of these further fins lies in the surface further Increasing for the heat transfer between the first part and the second part. Providing the fins with further fins creates what is known as a pine-tree profile with an in part significantly larger surface. This improves the thermal properties without negatively affecting the electrical properties.

In order, aside from the advantageous surface enlargement, also to be able to increase the adhesion, inserts such as pins etc. can also be introduced as connections between the components.

In order to further increase the adhesion of the individual components with one another or to increase the surface entirely, the surface of the components can be structured, for instance by etching, grit blasting, brushing, stamping and/or foaming. The surface of the first fins and/or the surface of the second fins then has a structuring at least in subregions.

In addition to structuring the surfaces between the first part and the second part of the insulator, the surfaces of the insulator which are directed toward the heat source or heat sink can also be structured in order to further improve the heat transfer between the heat source or heat sink and insulator. To this end, trapezoidal, triangular or rounded fins can be provided on this surface. The heat source or heat sink then have surfaces which correspond accordingly therewith. In this way the contact surface between the heat source or heat sink and insulator increases as in the case when connected in a flat, i.e. planar manner. This allows both more heat and also for a greater mechanical force to be transferred.

The space between the electrically conductive parts is filled with the insulating layer. To this end, a plastic insert (molded part) or a plastic casting can be used, for instance. It has proven to be particularly advantageous if the plastic casting is thermally conductive. An injection molding is also possible here. A ceramic insert, which is injected, glued or soldered and also glass or porcelain is also conceivable. Here the insulating material generally requires a significantly lower thickness compared with an air gap in order to electrically insulate the electrical potentials from one another adequately.

It has proven particularly advantageous if the ends of the fins are partially retracted. In this way these can be covered with the insulating material of the insulating layer, whereby the small distance at the ends no longer results in a critical air path.

The retraction reduces the surface which can be used to transfer heat, as a result of which said retraction should be minimal. The inner fins are covered completely, as a result of which they only have to be retracted minimally. The outer fins are arranged in a larger retraction, since here a complete air or creepage path is retained by way of the insulating material.

With a further advantageous embodiment of the invention, the insulating layer is made of a flexible material. As a result, mechanical stresses in the structure between a heat source fastened on one side of the insulator and a heat sink fastened on another side of the insulator are reliably prevented. In this process the insulating layer can balance out different expansions on account of a different temperature and thus prevent stress in the insulator.

Furthermore, an oscillation damping is possible when soft insulation materials are used for the insulating layer in addition to compensating for small mechanical shifts. If a casting is used, the electrically conductive components can be cast in a fixed manner with one another. In this way target dimensions of the insulator can be retained, even if the individual components have larger tolerances.

In a further advantageous embodiment of the invention, the thermally conductive insulator comprises a heat buffer, Phase change materials, also known as PCM, can be introduced into individual components of the insulator as a heat buffer. For instance, a PCM introduced on the heat source side would absorb "impact heat" introduced briefly.

The absorbed heat could then be transmitted during a larger time frame by way of a rather poor thermally conductive insulator. Moreover, the integration of a PCM into the insulation material is also possible. An overheating, even if this only occurs locally, can be reliably avoided in this way.

In a further advantageous embodiment of the invention, the heat sink is embodied as a cooling element, in particular as a heat pipe cooling element. It is herewith possible, particularly when heat pipes or heat diffusers are used, to enable an efficient heat transport even over longer distances.

BRIEF DESCRIPTION OF THE DRAWING

The invention is described and explained in more detail below on the basis of the exemplary embodiments shown in the Figures, in which.

DETAILED DESCRIPTION OF PREFERRED EMBODIMENTS

Figure 1:
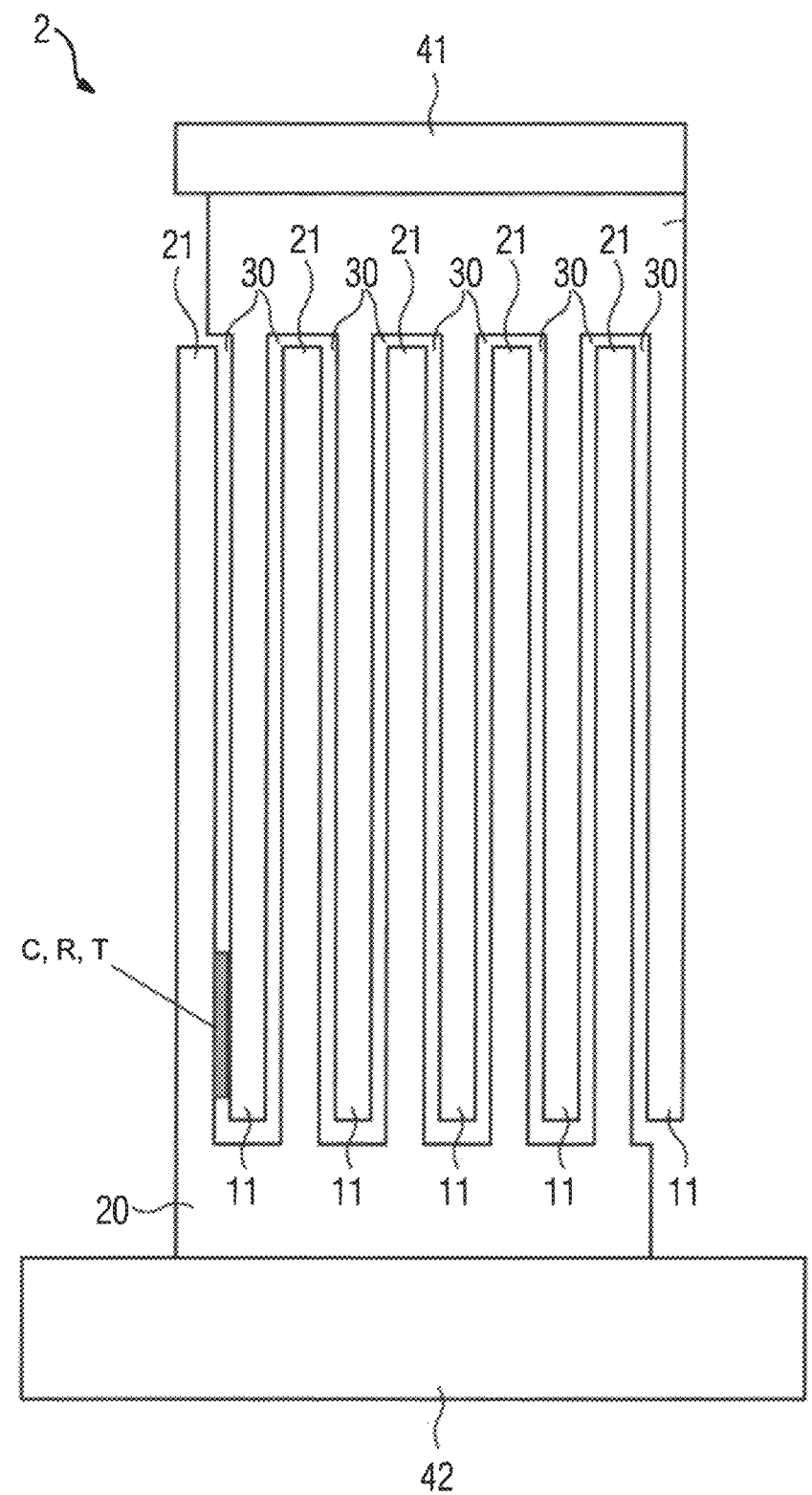
FIG. 1 to FIG. 3 show exemplary embodiments of a thermally conductive insulator.

FIG. 1 shows a two-dimensional view of a cooling arrangement 2. The cooling arrangement 2 comprises a thermally conductive insulator 1, a heat source 41 and a heat sink 42. Heat source 41 and heat sink are electrically insulated from one another by means of the thermally conductive insulator 1, since during operation these frequently have different electrical potentials. This is then the case, for instance, if a bus bar is fastened to a cooling element by means of the thermally conductive insulator 1.

For the insulating property, an insulating layer 30 which is not or only marginally electrically conductive is arranged between first fins 11 of a first part 10 of the thermally conductive insulator 1 and second fins 21 of a second part 20 of the thermally conductive insulator 1. The first fins 11 and second fins 21 are molded such that these mesh with one another and can accommodate an insulating layer 30 therebetween which is adequate for the electrical insulation. The surface between the first part and the second part is enlarged by the fins 11,21. This influences the thermal conductivity from the first part to the second part to the effect that this improves considerably. In particular, there is then an improvement if the material of the insulating layer 30 has rather poor thermal conductivity, such as frequently occurs with materials which have an electrically insulating effect.

Figure 2:
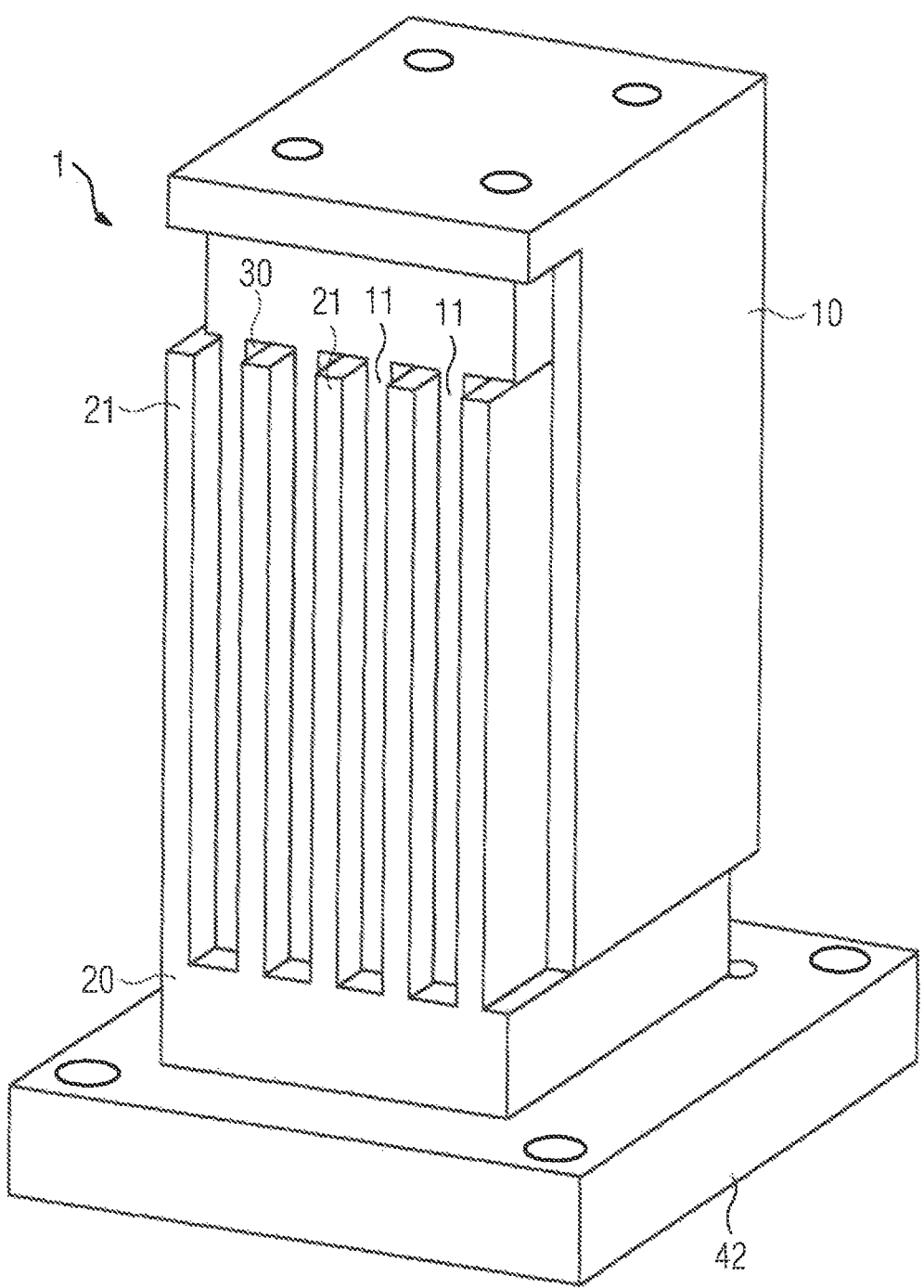
Figure 3:
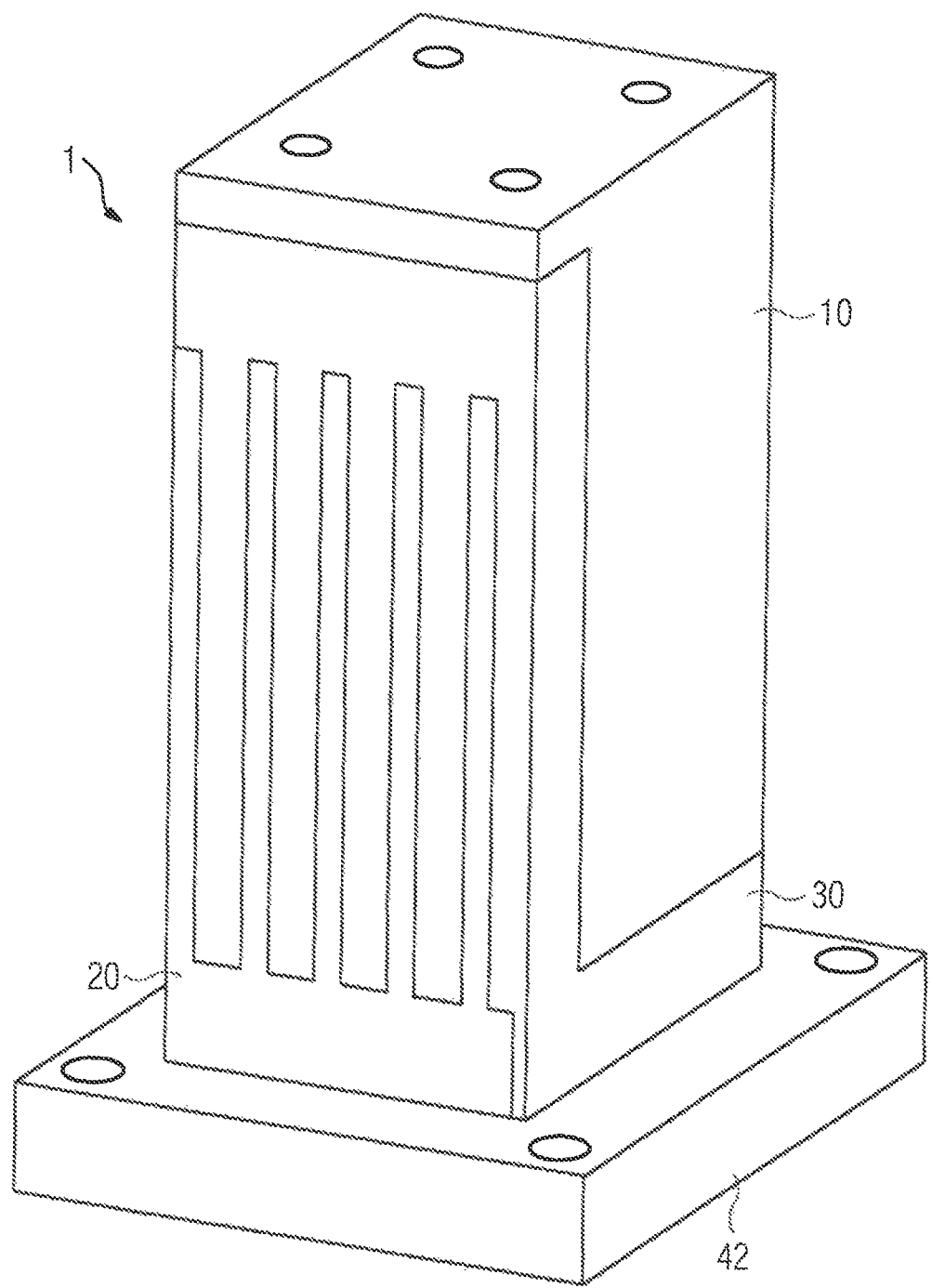

FIG. 2 shows a three-dimensional representation of the cooling arrangement 2. The heat source was omitted on the representation. For the avoidance of repetition, reference is made to the description relating to FIG. 1 and the reference signs therein. In this embodiment, the ends of the fins shown are partially retracted. As a result, these can be better covered with insulating material, for instance the material of the insulating layer 30, particularly in the edge region. The corresponding example is shown in FIG. 3. The formation of critical air paths is therefore reliably prevented. Since this retraction does not contribute to enlarging the surface which is effective for the heat transfer, the withdrawal should be selected to be small (<10%).

In summary, the invention relates to a thermally conductive insulator. In order to improve its thermal conductivity, it is proposed to equip the thermally conductive insulator with a first part with first fins, which are arranged on at least one surface of the first part, and a second part with second fins, which are arranged on at least one surface of the second part. Here the first fins and the second fins are arranged in such a way that they mesh with one another, wherein an insulating layer is arranged between the first part and the second part at least in the region of the fins. The invention further relates to a cooling arrangement with at least one such heat-conducting insulator, wherein the first part is connected to a heat source and the second part is connected to a heat sink.

The invention claimed is:

1. A cooling arrangement, comprising:
a thermally conductive insulator comprising a first part made from metal and including first fins arranged on a surface of the first part, a second part made from metal and including second fins arranged on a surface of the second part, the first and second fins meshing with one another, and an electrically insulating and thermally conductive layer made of a flexible material and arranged between the first and second parts in a region of the first and second fins for electrical insulation between the first and second part, ensuring a mechanical retaining function between the first and second part, while at the same time reducing stress in the insulator on account of a temperature difference between the first and second part;
a heat source connected to the first part of the thermally conductive insulator; and
a heat sink connected to the second part of the thermally conductive insulator, said heat sink being configured as a heat pipe cooling element.

2. The cooling arrangement of claim 1, wherein the thermally conductive insulator is arranged such as to ensure a mechanical fastening of a component of the cooling arrangement.

3. The cooling arrangement of claim 1, further comprising a busbar fastened to the coding element.

4. The cooling arrangement of claim 1, wherein the thermally conductive insulator includes a functional component arranged between the first and second parts, said functional component being at least one member selected from the group consisting of a capacitor, a resistor, and a temperature sensor.

5. The cooling arrangement of claim 1, wherein at least one of the first and second fins includes further fins.

6. The cooling arrangement of claim 1, wherein the thermally conductive insulator comprises a heat buffer.

7. A cooling arrangement, comprising:
a thermally conductive insulator comprising a first part made from metal and including first fins arranged on a surface of the first part, a second part made from metal and including second fins arranged on a surface of the second part, the first and second fins meshing with one another, and an electrically insulating and thermally conductive layer made of a flexible material and arranged between the first and second parts in a region of the first and second fins for electrical insulation between the first and second part, ensuring a mechanical retaining function between the first and second part, while at the same time reducing stress in the insulator on account of a temperature difference between the first and second part;
a heat source connected to the first part of the thermally conductive insulator;
a heat sink connected to the second part of the thermally conductive insulator, said heat sink being configured as a cooling element, and
a busbar fastened to the cooling element.

8. The cooling arrangement of claim 7, wherein the cooling element is configured as a heat pipe cooling element.

9. The cooling arrangement of claim 7, wherein the thermally conductive insulator is arranged such as to ensure a mechanical fastening of a component of the cooling arrangement.

10. The cooling arrangement of claim 7, wherein the thermally conductive insulator includes a functional component arranged between the first and second parts, said functional component being at least one member selected from the group consisting of a capacitor, a resistor, and a temperature sensor.

11. The cooling arrangement of claim 7, wherein at least one of the first and second fins includes further fins.

12. The cooling arrangement of claim 7, wherein the thermally conductive insulator comprises a heat buffer.

* * * * *